(12) United States Patent
Li et al.

(10) Patent No.: US 10,109,569 B2
(45) Date of Patent: Oct. 23, 2018

(54) VIA STRUCTURE AND CIRCUIT BOARD HAVING THE VIA STRUCTURE

(71) Applicant: DELTA ELECTRONICS (SHANGHAI) CO., LTD, Shanghai (CN)

(72) Inventors: Yuechao Li, Shanghai (CN); Weiyi Feng, Shanghai (CN); Weiqiang Zhang, Shanghai (CN); Hongyang Wu, Shanghai (CN); Ziying Zhou, Shanghai (CN)

(73) Assignee: Delta Electronics (Shanghai) CO., LTD, Shanghai (CN)

( * ) Notice: Subject to any disclaimer, the term of this patent is extended or adjusted under 35 U.S.C. 154(b) by 0 days.

(21) Appl. No.: 15/152,682

(22) Filed: May 12, 2016

(65) Prior Publication Data

US 2017/0018490 A1     Jan. 19, 2017

(30) Foreign Application Priority Data

Jul. 16, 2015   (CN) .......................... 2015 1 0419313

(51) Int. Cl.
*H01L 23/498*   (2006.01)
*H05K 1/02*     (2006.01)
*H05K 1/11*     (2006.01)

(52) U.S. Cl.
CPC .. *H01L 23/49827* (2013.01); *H01L 23/49822* (2013.01); *H05K 1/0263* (2013.01);
(Continued)

(58) Field of Classification Search
CPC ......... H01L 23/49827; H01L 23/49838; H01L 23/49822; H01L 25/105; H01L 23/552;
(Continued)

(56) References Cited

U.S. PATENT DOCUMENTS

2004/0163846 A1* 8/2004 Novak ................. H01L 23/50
                                                    174/255
2004/0238216 A1* 12/2004 Jessep ................. H05K 1/024
                                                    174/262
(Continued)

FOREIGN PATENT DOCUMENTS

CN       1816244 A      8/2006
CN     102458034 A      5/2012

OTHER PUBLICATIONS

The Chinese 1OA issued by SIPO dated Jul. 23, 2018.

*Primary Examiner* — Mouloucoulaye Inoussa
(74) *Attorney, Agent, or Firm* — Yunling Ren

(57) ABSTRACT

The present disclosure provides a via structure and a multilayer circuit board including the via structure. The via structure is provided in three or more conductor layers in the same electrical network, the conductor layers overlapping with each other vertically and including at least one current input layer and at least one current output layer; wherein the via structure includes a plurality of rows of vias, each row of vias puncture through at least one current input layer and at least one current output layer, and a part of the rows of vias puncture through all of the conductor layers, and the other part of the rows of vias puncture through a part of the conductor layers. By using the via structure in the present disclosure, the vias are subject to even temperature and thus the lifetime of the circuit board is extended.

9 Claims, 15 Drawing Sheets

(52) U.S. Cl.
CPC ..... *H05K 1/115* (2013.01); *H05K 2201/0979* (2013.01); *H05K 2201/09409* (2013.01)

(58) Field of Classification Search
CPC .... H01L 24/48; H05K 1/0225; H05K 1/0231; H05K 1/0298
USPC ................ 361/799, 816, 818, 794, 792, 795
See application file for complete search history.

(56) References Cited

U.S. PATENT DOCUMENTS

| | | | |
|---|---|---|---|
| 2006/0180917 A1* | 8/2006 | Djordjevic | H05K 1/0216 257/691 |
| 2011/0067917 A1* | 3/2011 | Park | H05K 1/0236 174/350 |

\* cited by examiner

US 10,109,569 B2

VIA STRUCTURE AND CIRCUIT BOARD HAVING THE VIA STRUCTURE

CROSS-REFERENCE TO RELATED APPLICATIONS

This application claims priority to Chinese Patent Application No. 201510419313.5, filed Jul. 16, 2015, the entire contents of which are incorporated herein by reference.

TECHNICAL FIELD

The present disclosure generally relates to printed circuit board technologies, and more particularly to a via structure in a printed circuit board.

BACKGROUND

With the rapid development of power electronics, Printed Circuit Boards (PCBs) are widely applied in product designs and developments. In order to meet the requirements such as high performance and high reliability of products, the layout and wiring of PCBs becomes a focus in the field.

A multilayer PCB includes a plurality of conductor layers and a plurality of insulation layers disposed between adjacent conductor layers. In the layout of a multilayer PCB (two or more layers), vias are generally used for realizing electrical connections between two or more conductor layers. If there are more than three conductor layers in a PCB, the inner conductor layer have to be electrically connected with the electronic devices on the outer conductor layers by means of vias, such as through holes, blind vias or buried vias.

The arrangements of vias in a PCB will be described below. There are generally the following types of arrangements.

1. One-to-One Type

The one-to-one type arrangement generally refers to that one or more conductor layers in a PCB are connected with another one or more conductor layers using vias, and the number of the one or more conductor layers is the same as the number of the another one or more conductor layers.

FIG. 1 is a schematic diagram showing a conventional one-to-one type via arrangement. As shown in FIG. 1, a conductor layer 81 in a PCB is connected with another conductor layer 82 using a plurality of vias 83. In order to realize reliable connections between the conductor layers 81 and 82, a plurality of rows of vias 83 may be used and the numbers of the vias 83 in respective rows are the same. In FIG. 1, a total of six rows of vias each of which includes five vias are used for the connections between the conductor layers 81 and 82. In addition, for the convenience in description, insulation layers (for example, base materials formed by FR4) disposed between the conductor layers in the PCB are omitted in this figure and thereby related descriptions are note elaborated here.

2. One-to-Many Type Arrangement

The one-to-many type arrangement generally refers to that one or more conductor layers in a PCB are connected with a plurality of conductor layers using vias, and the number of the one or more conductor layers is different from the number of the plurality of conductor layers.

FIG. 2 is a schematic diagram showing a conventional one-to-many via arrangement. As shown in FIG. 2, a conductor layer 91 in a PCB is connected with other three conductor layers (i.e., conductor layers 92, 93 and 94) using vias 95. Similarly, in order to realize reliable connections between the conductor layer 91 and the other three conductor layers, total of six rows of vias each of which includes five vias are used for the connections between the conductor layers 91 and the other three conductor layers.

As can be seen from the above connections using vias, if it is desired to realize reliable connections between conductor layers, the prevailed method in conventional technologies is to increase the number of vias. However, in most cases, due to the limitation of the area of a PCB, the number of vias cannot be increased too much.

Further, due to limitations of existing manufacturing steps, walls of the vias are relatively thin and therefore the impedance of the vias is relatively large. Also, there is an overlapping region between the conductor layers using vias, and the current flowing through the circuit will converge at an edge of an overlapping region. Consequently, the vias in outer rows will withstand the converged current and the current density of the current flowing through the vias in outer rows will become large. Besides, when vias using one-to-many type arrangement, the current density of the current flowing through the vias in a smaller number of the conductor layers will become even larger, and the loss of these vias will be increased rapidly, thereby these vias in outer rows will be subject to high temperatures and may seriously influence the lifetimes of the PCBs.

SUMMARY

In view of the above limitations in electrical performance of existing vias, the present disclosure proposes a novel PCB and a via structure in the PCB.

Embodiments of the present disclosure provide a via structure, provided in three or more conductor layers in the same electrical network, the conductor layers overlapping with each other vertically and including at least one current input layer and at least one current output layer;

wherein the via structure includes a plurality of rows of vias, each row of vias puncture through at least one current input layer and at least one current output layer, and a part of the rows of vias puncture through all of the conductor layers, and the other part of the rows of vias puncture through a part of the conductor layers.

Embodiments of the present disclosure further provide a via structure, provided in two or more conductor layers in the same electrical network, the conductor layers overlapping with each other vertically and comprising at least one current input layer and at least one current output layer;

wherein the via structure comprises a plurality of rows of vias, each row of vias puncture through at least one current input layer and at least one current output layer, an in-out ratio of each row of vias is (A+1)A, where A is an positive integer;

wherein when the number of conductor layers from which current flows into one row of vias is M, the number of conductor layers which the current from the row of vias flows to is N, the in-out ratio equals is defined as N/M if N≥M, or M/N if N≤M.

Embodiments of the present disclosure further provides a multilayer circuit board, including conductor layers and the above via structure provided in the conductor layers.

In the via structures and PCBs disclosed in embodiments of the present disclosure, reliable connections between conductor layers in a PCB can be realized without increasing number of vias, and thereby the present disclosure can avoid the problems of large resistance and high temperature of vias due to thin walls and large current density. Consequently, the lifetimes of the PCB are lengthened, and thus the product reliability is improved.

BRIEF DESCRIPTION OF THE DRAWINGS

The drawings, as a part of the specification, are incorporated into the specification, illustrate embodiments of the present disclosure and are used for explaining the principles of the present disclosure.

DETAILED DESCRIPTION

Exemplary embodiments, examples of which are illustrated in drawings, will be described below in detail. Throughout the drawings, the like reference numbers represent the same or like elements, unless stated otherwise. The embodiments described below do not represent all the implementations in conformity with the present disclosure; instead, they are just a part of examples of devices or methods as set forth in appended claims according to some aspects of the present disclosure.

Aiming at the deficiencies of the above-mentioned one-to-one via arrangement and one-to-many via arrangement, embodiments of the present disclosure propose a novel via structure which will be described below by different embodiments. It shall be noted that the via structure in embodiments of the present disclosure are in the same electronic network, i.e., the potentials of all vias are the same after conductor layers in a PCB are interconnected with each other using the vias.

Figure 1:
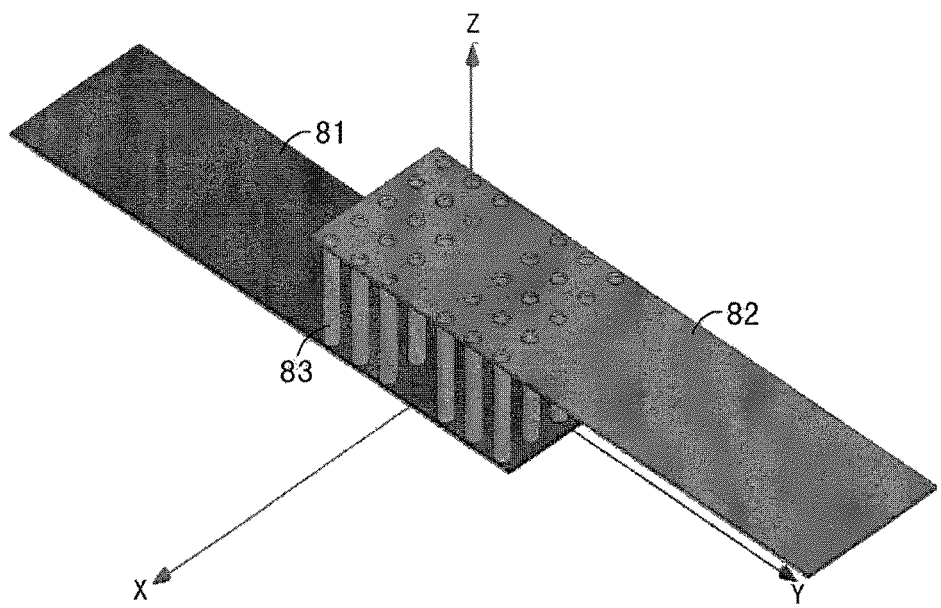
FIG. 1 is a schematic diagram showing a conventional PCB and a one-to-one via arrangement.
Figure 2:
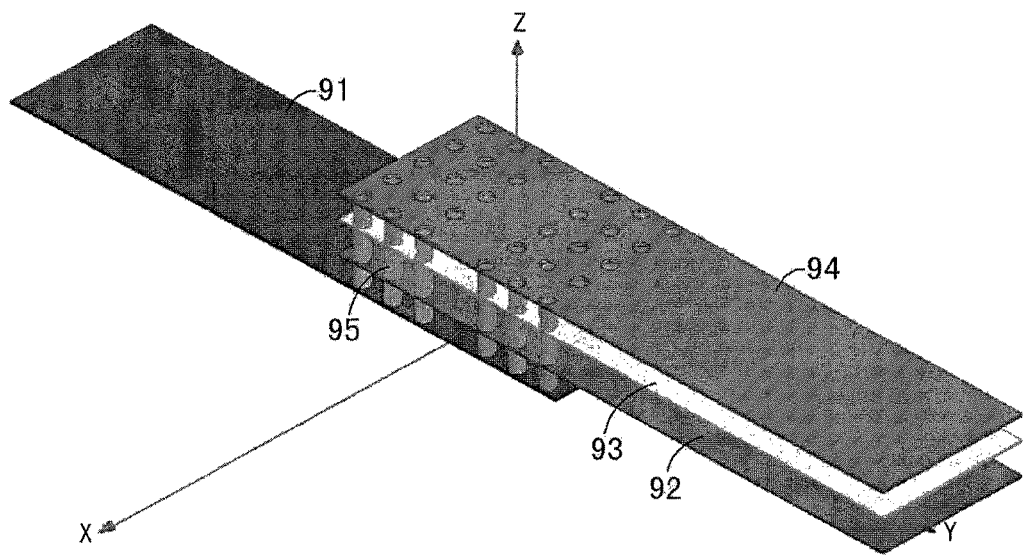
FIG. 2 is a schematic diagram showing a conventional PCB and a one-to-many via arrangement.
Figure 3:
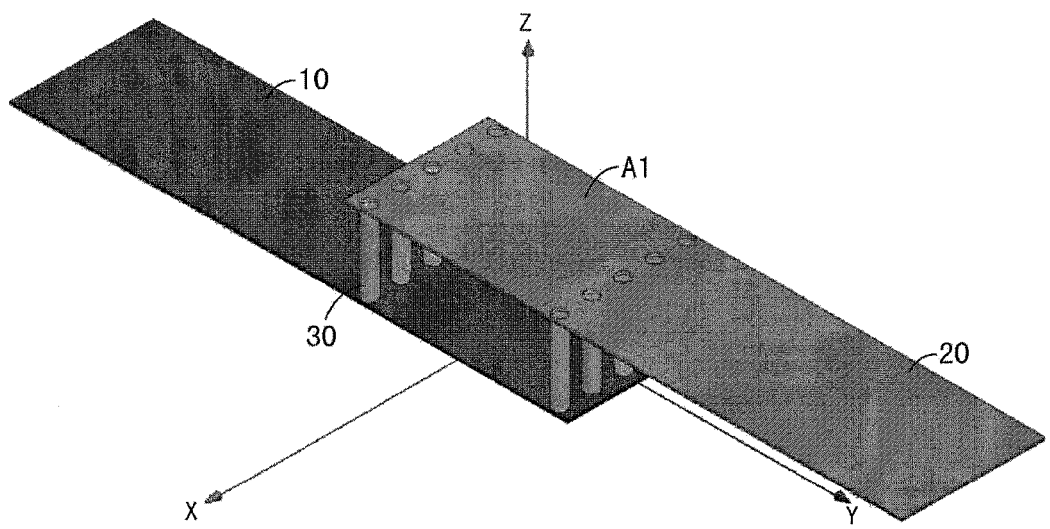
FIG. 3 is a schematic diagram showing a one-to-one via structure for connecting conductor layers according to an embodiment of the present disclosure.

FIG. 3 is a schematic diagram showing a one-to-one via structure in a PCB according to an embodiment of the present disclosure. As shown in FIG. 3, the one-to-one arrangement refers to that current flows into the via structure through one conductor layer, passes through the vias and then flows out through another conductor layer, and the number of the conductor layer from which the current flows into the via structure equals to the number of the conductor layer which the current from the via structure flows to. The thicknesses of respective conductor layers may be the same or not, and the follow descriptions will be made with an example where the thicknesses of respective conductor layers are the same.

As shown in FIG. 3, in the same electronic network, vias 30 of the via structure in the present embodiment are provided in an overlapping region A1 of a conductor layer 10 and a conductor layer 20.

In an embodiment, in order to reduce the entire resistance of the conductor layers, as shown in FIG. 3, a plurality of vias 30 are provided at edges of the overlapping region A1 of the conductor layer 10 and the conductor layer 20. After the two conductor layers are connected with each other, the overlapping region A1 is connected in parallel in the circuit as its biggest area to effectively reduce the resistance of the overlapping region A1 and thereby effectively reduce the entire resistance of the conductor layers. In FIG. 3, for example, two rows of vias are provided at the left edge and the right edge of the overlapping region, and however the present disclosure is not limited to this. In other embodiments, there may be only one row of vias disposed at the left edge or the right edge of the overlapping region, or the arrangement of vias may be determined based on actual requirements.

Figure 4:
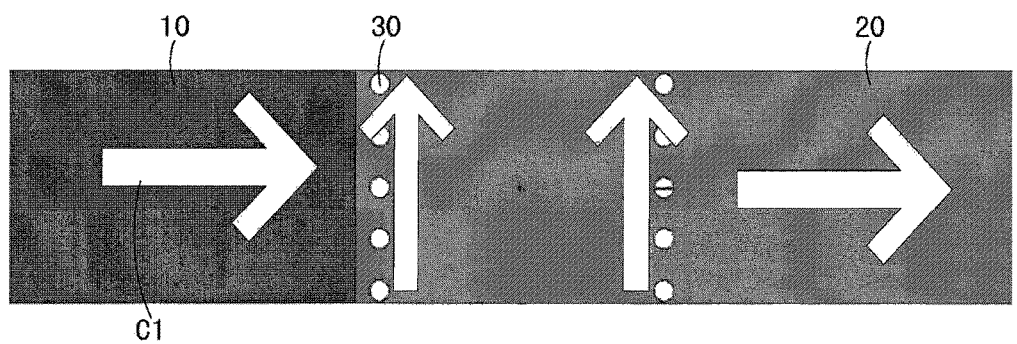
FIG. 4 is a top view of FIG. 3.

FIG. 4 is a top view of FIG. 3, in which a current direction C1 is illustrated. As shown in FIG. 4, in order to make the current evenly flow through each of the vias 30 in the overlapping region A1, the arrangement direction of the vias 30 may be perpendicular to the flowing direction C1 of the current in the circuit. In the first embodiment as shown in FIGS. 3 and 4, the current flowing direction C1 is from left to right, and two rows of vias 30 are provided at the left and right edges of the overlapping region A1, respectively, along a direction perpendicularly to the current flowing direction C1.

Figure 5:
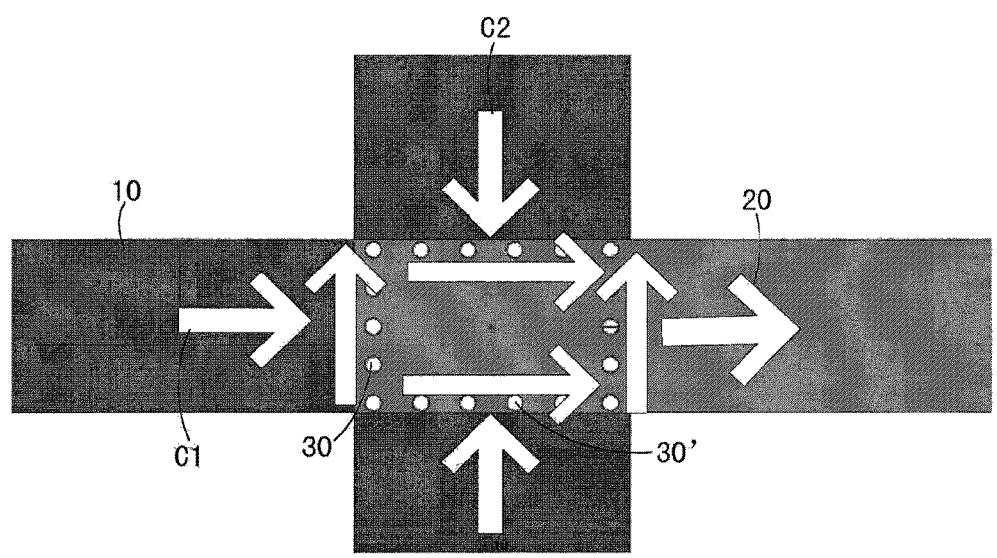
FIG. 5 is a schematic diagram showing a one-to-one via structure in a PCB according to another example of the present disclosure.

FIG. 5 is a one-to-one via structure in a PCB according to another embodiment. As compared with FIG. 4, current flowing along another direction C2 (from top to bottom as shown) is also shown in FIG. 5. Also, vias 30' are provided at the upper and lower edges of the overlapping region A1, and the arrangement direction of the vias 30' is perpendicular to the direction C2 along which the current flows into the overlapping region A1.

In an embodiment, each row of vias 30 may be arranged densely to make the current flowing through each of the vias within a certain threshold. In the via structure, a plurality of rows of vias may be provided, a distance between vias 30 in at least two adjacent rows may be smaller than a size of a via, and at this time, the current flowing through the vias 30 in the adjacent rows are substantially the same. In the embodiment, the size of the via may be the biggest outer diameter of a via, and however the present disclosure is not limited to this. The numbers of the vias 30 in different rows may be the same or not. In an embodiment, the row which includes the largest number of vias may be arranged close to the edge of the overlapping region A1, and thus even there is a large current flowing in the circuit, it can be guaranteed that the current density withstood by a single via in the row will not exceed a withstanding limit.

Figure 6:
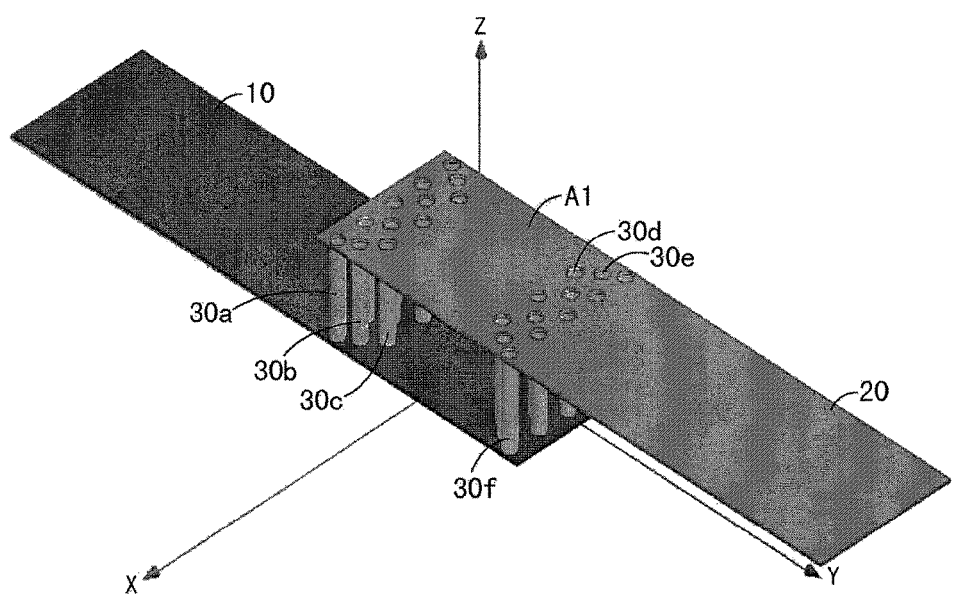
FIG. 6 is a schematic diagram showing a one-to-one via structure in a PCB according to another example of the present disclosure.

FIG. 6 is a one-to-one via structure in a PCB according to another embodiment, In the embodiment, a plurality of rows of vias are arranged at both edges (i.e., the left and right edges) of an overlapping region A1 of a conductor layer 10 and a conductor layer 20. For example, a first via row includes a plurality of vias 30a, a second via row includes a plurality of vias 30b, a third via row includes a plurality of vias 30c, a fourth via row includes a plurality of vias 30d, a fifth via row includes a plurality of vias 30e, and a sixth via row includes a plurality of vias 30f. The first to third via rows are arranged at the left edge of the overlapping region A1 to form a first via group, and the fourth to sixth via rows are arrange at the right edge of the overlapping region A1 to form a second via group. The distance between adjacent via rows in the first via group is smaller than the size of the largest via among the first group of vias, and the distance between adjacent via rows in the second via group is smaller than the size of the largest via among the second group of vias. Further, the closer a row located to an edge of the overlapping region A1, the larger the number of the vias included in the row will be.

It shall be noted that only two via groups 30 are illustrated in FIG. 6, and however, in actual products, there may be a plurality of current flowing directions in a PCB, and thus a plurality of via groups arranged along directions perpendicular to different current flowing directions maybe disposed in the overlapping region.

Figure 7:
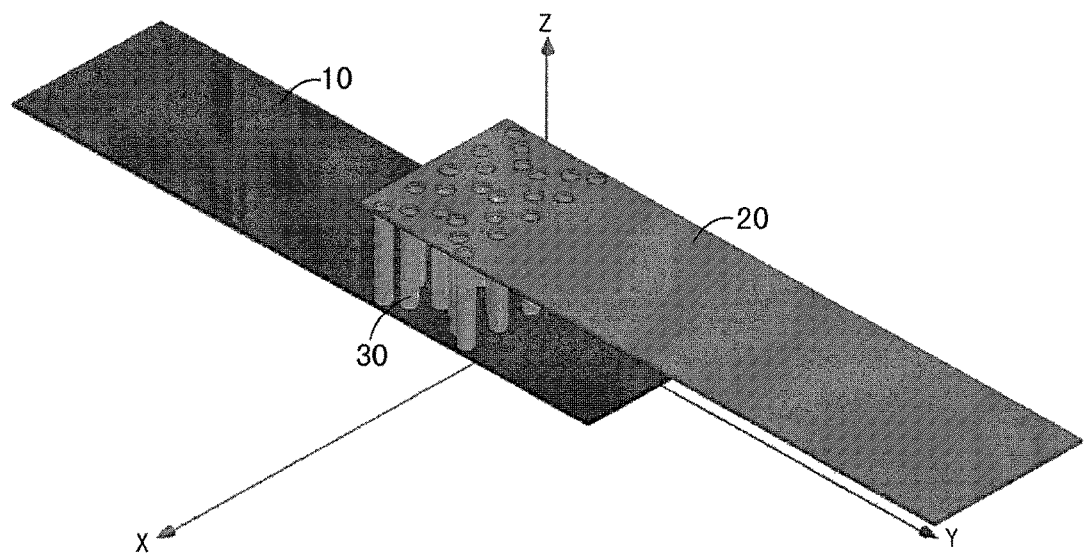
FIG. 7 is a schematic diagram showing a one-to-one via structure in a PCB according to another example of the present disclosure.

In order to realize a smallest entire resistance of the circuit, vias are arranged at the positions close to edges of the overlapping region A1, and however in other situations where low requirements are imposed on the resistance, it is not necessary to dispose all the vias 30 along the edges. For example, as shown in FIG. 7, vias 30 in an overlapping region A1 of a conductor layer 10 and a conductor layer 20 are all arranged close with each other.

In the present disclosure, a row of vias refer to adjacent vias which are arranged along a direction perpendicular to a current flowing direction. In the same group of vias, vias in each of rows are arranged along a direction perpendicular to corresponding current flowing direction.

Figure 8:
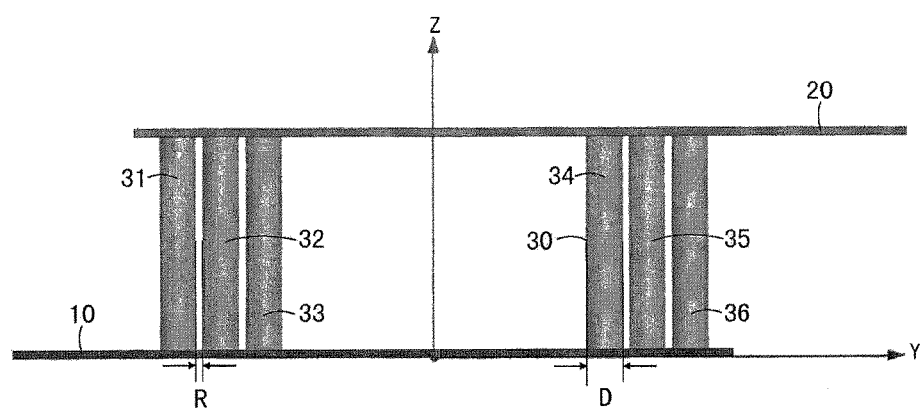
FIG. 8 is a front view of FIG. 6.
Figure 9:
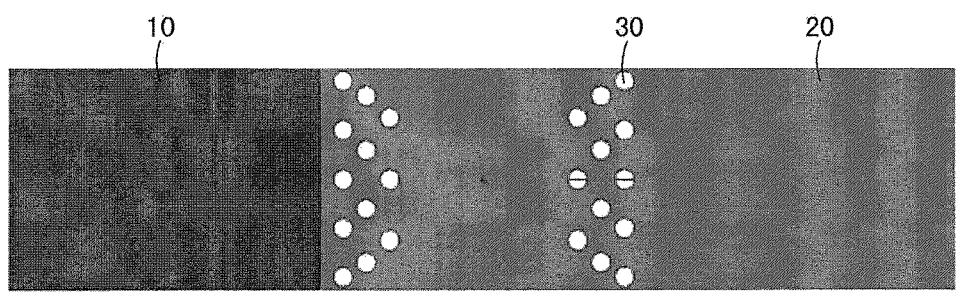
FIG. 9 is a top view of FIG. 6.

Detailed descriptions are made below with reference to FIGS. 8 and 9. FIGS. 8 and 9 are front and top views of FIG. 6, respectively. As shown in FIGS. 6, 8 and 9, in order to meet the requirements of large current, in the embodiment, a total of six rows of vias are arranged in an overlapping region A1 of a conductor layer 10 and a conductor layer 20. Aiming at arriving at a low entire resistance of the conductor layers, the six rows of vias 30 are arranged at the left and right edges of the overlapping region A1. Specifically, in the embodiment, three rows of vias are arranged at the left edge of the overlapping region A1 of the conductor layer 10 and the conductor layer 20, and three rows of vias are arranged at the right edge of the overlapping region A1 of the conductor layer 10 and the conductor layer 20. The distance between at least two adjacent via rows from the first row of vias 31 to the third row of vias 33 at the left edge may be smaller than a size of a via, and the distance between at least two adjacent via rows from the fourth row of vias 34 to the six row of vias 36 at the right edge may be smaller than the size of the via. As shown in FIG. 8, the distance between the first via row 31 and the second via row 32 is R, the largest via diameter is D, and R<D. The first via row 31 includes relatively large number of vias and may be arranged at the outer edge side (i.e., the edge of the overlapping region of the conductor layers 10 and 20). Similarly, the number of the six via row 36 may be relatively large and may be arranged at the right edge.

In addition, the arrangement and number of vias in the first to six rows in FIG. 6 may be as shown in FIG. 9, in which the arrangement direction of each via row is perpendicular to the flowing direction of the current in the conductor layers. Further, it shall be noted that the vias in the first to six rows may be shaped as hollow round holes or may be of other shapes, for example, triangle or ellipse. If the vias are not shaped as circle holes, the size of the via in the present disclosure may refer to the largest length of a via along respective directions of the via, for example, the length of the major axis of an ellipse, or the distance of two vertexes of a triangle which are separated from each other furthest. In the present disclosure, the vias are of circle shapes, for example.

Figure 10:
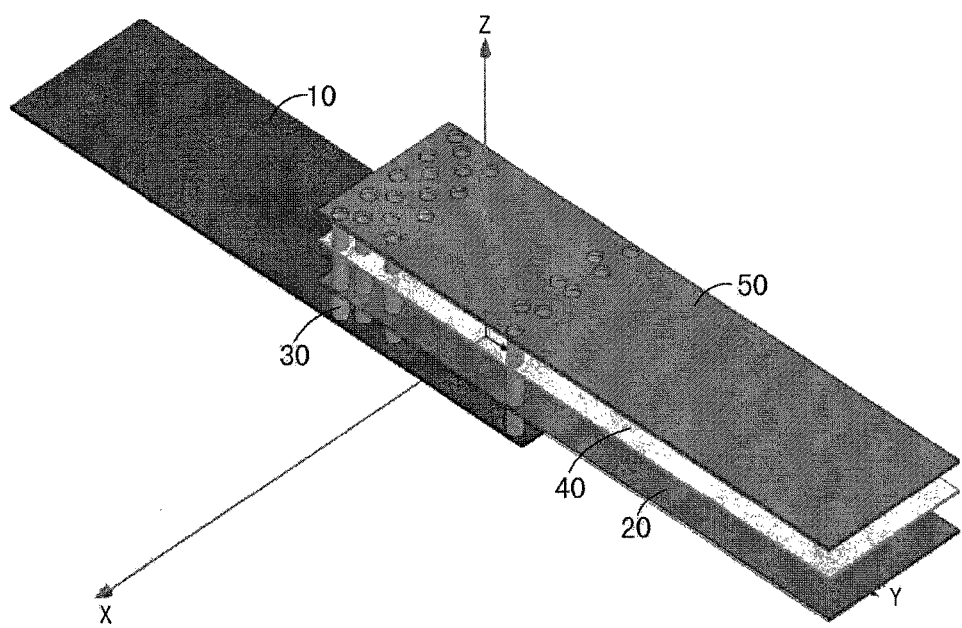
FIG. 10 is a schematic diagram showing a one-to-many via structure in a PCB according to another embodiment of the present disclosure.

FIG. 10 is a schematic diagram showing a one-to-many via structure in a PCB according to an embodiment of the present disclosure. As shown in FIG. 10, the one-to-many arrangement refers to that current flows into the via structure through one conductor layer, passes through the via structure and then flows out through another plurality of conductor layers; or the current flows into the via structure through a plurality of conductor layers, passes through the via structure and then converges to a single conductor layer to flow out. The number of the conductor layers from which the current flows into the via structure is different from the number of the conductor layers which the current from the via structure flows to. The thicknesses of respective conductor layers may be the same or not, and the follow descriptions will be made with an example where the thicknesses of respective conductor layers are the same.

As shown in FIG. 10, similarly to the one-to-one arrangement in a PCB, in the same electronic network, vias 30 in the via structure of the present embodiment are arranged in an overlapping region A2 of a conductor layer 10 and conductor layers 20, 40 and 50.

Similarly to the above embodiment, in an embodiment of one-to-many via structure, vias may be arranged along edges of overlapping regions of the conductor layers. Also, similarly to the one-to-one via structure, in order to reduce the entire resistance of the conductor layers, the vias may be arranged at the edges of the overlapping regions of the conductor layers. As shown in FIG. 10, vias 30 are arranged at both left and right edges of an overlapping region A2 of the conductor layer 10 and the conductor layers 20, 40 and 50.

In the embodiment, the arrangement direction of the vias (i.e., the direction along which the vias are arranged) in the overlapping region may be perpendicular to the current flowing directions. Similarly to the one-to-one via structure, in order to make the current evenly flow through each row of vias, the vias in each row may be arranged along a direction perpendicular to the flowing direction of the current in the circuit. As shown in FIG. 10, the current flows in from the conductor layer 10, passes through the vias, and then flows out through the conductor layers 20, 40 and 50, and the current flowing direction is from left to right, i.e., from the conductor layer 10 to the conductor layers 20, 40 and 50. In the overlapping region A2, four rows of vias are arranged at the left edge, two rows of vias are arranged at the right edge, and each row of vias are arranged along a direction perpendicular to the current flowing direction.

Further, in the embodiment, if there are large current flowing through the overlapping region A2, vias may be arranged at the edges as many as possible.

In the embodiment, similarly to the one-to-one via structure in a PCB, if the current in the circuit is too large and thus single row of vias cannot meet the requirements, the via structure may include a plurality of rows of vias, and the distance between at least two adjacent via rows among the plurality of row of vias may be smaller than the size of the via, and also, the numbers of the vias 30 in different rows may be the same or not. In an embodiment, the via row which includes the largest number of vias may be arranged close to the edge of the overlapping region.

In an embodiment, if a via structure connects a plurality of conductor layers, i.e., the via structure intersects with a plurality of conductor layers, the number of vias rises with increasing of a ratio which is defined as N/M if N≥M, or M/N if N≤M, wherein N is the number of conductor layers from which the current flows into the via structure, and M is the number of conductor layers which the current from the via structure flows to. Hereinafter, the ratio will be referred to as in-out ratio of a via.

According to the definition of the ratio, if the number of conductor layers from which the current flows into the vias equals to the number of conductor layers which the current from the vias flows to, the minimum value of the ratio is 1; if the number of conductor layers from which the current flows into the vias differs from the number of conductor layers which the current from the vias flows to, the minimum value of the ratio is (M+1)/M (that is, the difference between the number of conductor layers from which the current flows into the vias and the number of conductor layers which the current from the vias flows to equals to one), wherein M is the smaller of the two numbers of conductor layers, i.e., number of conductor layers from which the current flows into the vias and the number of conductor layers which the current from the vias flows to.

Figure 11:
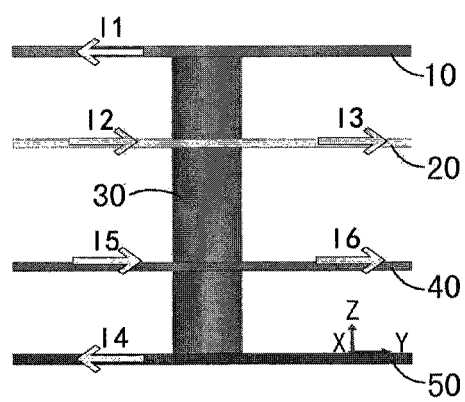
FIG. 11 illustrates flowing-in and flowing-out of current.

The computation of the in-out ratio will be described below. As shown in FIG. 11, the number of conductor layers intersecting with a via 30 is four, and among the four conductor layers, the number of the conductor layers from which the current flows into the via 30 is two (see I2 in the conductor layer 20 and I5 in the conductor layer 40), and the number of the conductor layers which the current from the via 30 flows to is four (see I1 in the conductor layer 10, I3 in the conductor layer 20, I6 in the conductor layer 40 and I4 in the conductor layer 50). Then, the in-out ratio is 4/2=2.

For a single via, the larger the in-out ratio is, the larger the current stress withstood by the via will be. In order to reduce the current stress, in a single via row, the number of the vias included in the row may be as large as possible. If the single via row cannot meet requirements, a plurality of rows of vias may be provided and the distance between at least two adjacent rows may be smaller than the biggest outer diameter of a via.

In the embodiment, if the space of the overlapping region A2 of conductor layers allows, the in-out ratios of the vias 30 at the edges of the overlapping region A2 may not be too large, for example, the ratio of each row of vias 30 may be set as relatively small or not in excess of a particular value.

Figure 12:
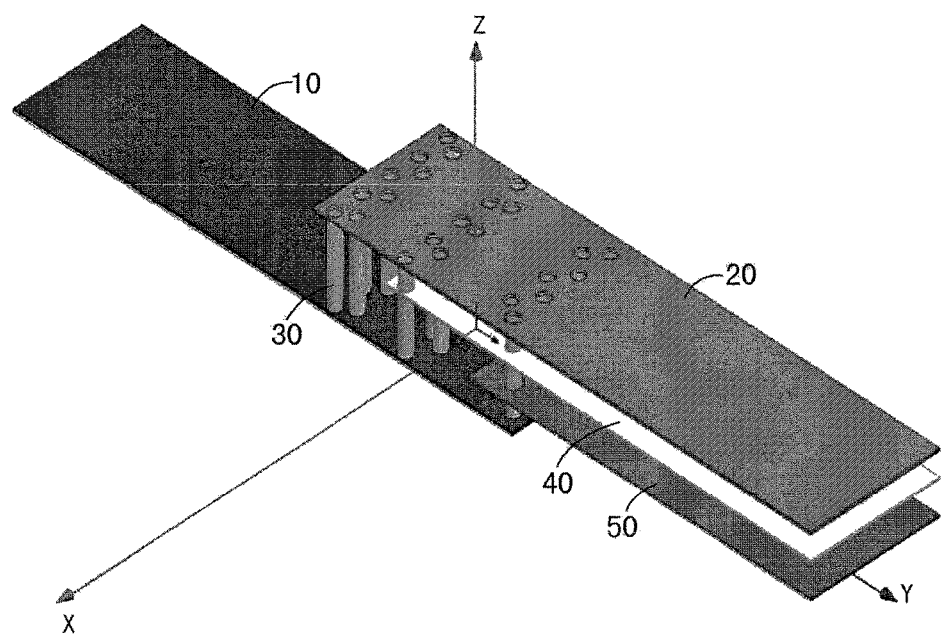
FIG. 12 is a schematic diagram showing a one-to-many via structure in a PCB according to another embodiment of the present disclosure.
Figure 13:
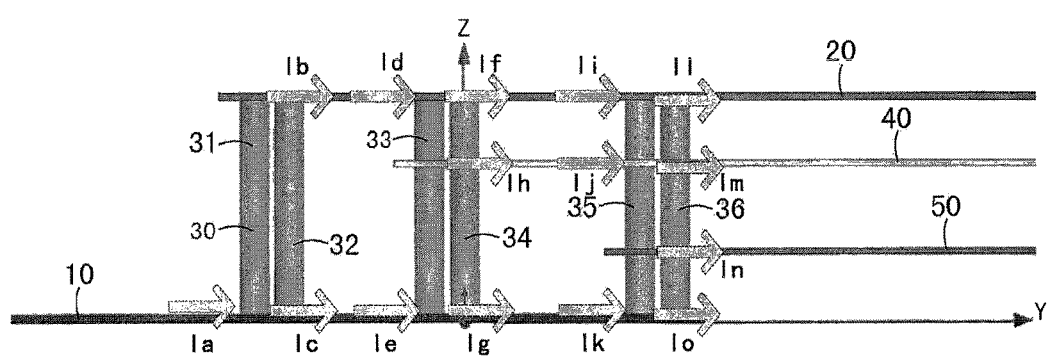
FIG. 13 is a left cross-sectional view of FIG. 12.
Figure 14:
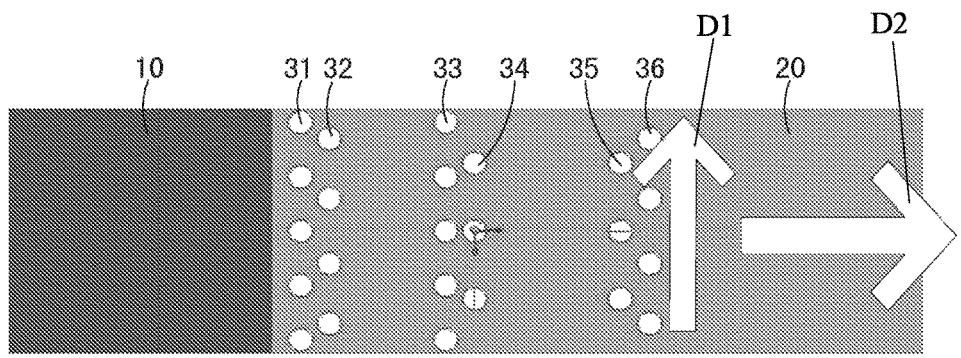
FIG. 14 is a top view of FIG. 12.

FIG. 12 shows a one-to-many via structure in a PCB according to an embodiment of the present disclosure. FIGS. 13 and 14 are a left cross-sectional view and a top view of FIG. 12, respectively. In FIG. 12, the current flows in through a conductor layer 10, passes through the vias, and then flows out through conductor layers 20, 40 and 50. In the embodiment, by changing the combination of the conductor layers in the overlapping region A2, a plurality of overlapping regions are combined, and thus the in-out ratios of vias in each overlapping region are maintained at a relatively small value, i.e., (M+1)/M or 1.

As shown in FIGS. 12 and 13, a first overlapping region refers to an overlapping region of a combination of conductor layers 10 and 20 which are connected with each other using a first via row 31 and a second via row 32; a second overlapping region refers to an overlapping region of a combination of conductor layers 10, 20 and 40 which are connected with each other using a third via row 33 and a fourth via row 34; a third overlapping region refers to an overlapping region of a combination of conductor layers 10, 20, 40 and 50 which are connected with each other using a fifth via row 35 and a sixth via row 36. It can be seen that the in-out ratio of the first via row is 2 (i.e., currents Ib and Ic flow out through two conductor layers, and the current Ia flows in through one conductor layer), the in-out ratio of the third via row 33 is 3/2 (i.e., currents If, Ig and Ih flow out through three conductor layers, and the currents Id and Ie flow in through two conductor layers), and the in-out ratio of the fifth via row 35 is 4/3 (i.e., currents Il, Im, In and Io flow out through four conductor layers, and the currents Ii, Ij and Ik flow in through three conductor layers). In the same way, it can be seen that the in-out ratios of the second via row 32, the fourth via row 34 and the sixth via row 36 are 1, 1, and 4/3, respectively. Thus, in FIG. 12, the biggest in-out ratio is 2, which is smaller than the biggest in-out ratio in FIG. 10 (the biggest ratio in FIG. 10 is 4, i.e., the in-out ratio of the first via row). In this way, by combining a plurality of overlapping regions and setting the in-out ratios of vias correspondingly, the currents withstood by vias may be reduced, and thereby the lifetime of the circuit may be extended.

Figure 15:
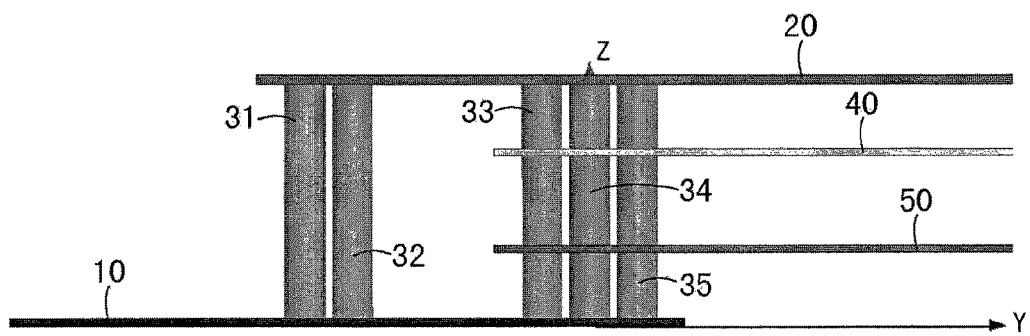
FIG. 15 illustrates another embodiment of the present disclosure.

In the embodiment, three overlapping regions formed by different conductor layers are employed to keep the in-out ratios of the vias in each overlapping region maintained at a relatively small value, i.e., (A+1)/A, where A is a positive integer. However, in some embodiments, the spaces in the overlapping regions are limited, and combinations of a plurality of different overlapping regions cannot be employed. Under such condition, in order to avoid too large in-out ratio of vias in overlapping regions, a part of the overlapping regions may be combined. Then, not all the in-out ratios of the vias in the overlapping regions shall be the smallest values, as long as all of them are smaller than a particular value, for example, smaller than 2. As shown in FIG. 15, the structure as shown in FIG. 12 may be realized by two combinations of overlapping regions. FIG. 15 illustrates another embodiment of the present disclosure, in which a first overlapping region refers to an overlapping region of a combination of conductor layers 10 and 20 which are connected with each other using first and second via rows 31 and 32, a second overlapping region refers to an overlapping region of a combination of conductor layers 10, 20, 40 and 50 which are connected with each other using third, fourth, and fifth via rows 33, 34 and 35. Based on the similar computation to FIG. 13, the in-out ratio of the first via row is 2 (i.e., current flows in through one conductor layer and currents flow out through two conductor layers), and the in-out ratio of the third via row is 4/2=2 (i.e., currents flow in through two conductor layers, and currents flow out through four conductor layers). Similarly, both the in-out ratios of the second via row 32 and the fourth via row 34 equal to 1, and the in-out ratios of the fifth via row 35 is 4/3. Thus, the biggest of all the in-out ratios is 2, the same as that in FIG. 13. What is different is that the in-out ratio of the third via row 33 is 2 instead of the minimum value (A+1)/A, but the biggest of the in-out ratios in FIG. 15 is the same as that in FIG. 13, and both of the biggest values in FIGS. 13 and 15 are smaller than that in FIG. 10.

Further, one of ordinary skill in this art shall appreciate that with respect to FIG. 15, if the total number of the conductor layers changes, the combinations of the overlapping regions become more varied, without being limited to the combinations as shown in FIG. 15.

In the embodiment as shown in FIG. 12, at least three conductor layers (four conductor layers are shown) and at least two types of vias (three types are shown, i.e., the via type for connecting two conductor layers, the via type for connecting three layers and the via type for connecting four conductor layers) are included, these types of vias separate three overlapping regions, and the smallest values of the in-out ratios of vias in the three overlapping regions are (A+1)/A or 1, and the biggest values of the in-out ratios of vias in the three overlapping regions do not exceed 2.

In the embodiment, in order to guarantee that the current flowing through each via is even, the in-out ratios of the vias may be maintained at the smallest values or not in excess of a particular value. As shown in FIG. 12, three overlapping regions are provided to meet the requirement that the in-out ratios of vias in each row are maintained at the smallest values, the biggest one of which does not exceed 2.

Further, in order to meet the requirement of large current, a plurality of rows of vias may be arranged. For example, six rows of vias are arranged in FIG. 12.

Also, an overlapping region in which in-out ratios of vias are relatively large generally includes relatively large number of vias. For example, it is assumed that one group of vias are arranged in one overlapping region, and different groups of vias are arranged in different overlapping regions. FIG. 14 is a top view of FIG. 13. As shown in FIGS. 13 and 14, a first via group is composed of a first via row 31 and a second via row 32 which are arranged in a first overlapping region. The in-out ratio of the first via row 31 is 2, which is relatively large, and thus relatively large number of vias need to be arranged. In the embodiment, the first via group includes the first via row which is composed of 5 vias and the second via row which is composed of four vias to reduce the current flowing through each via, and the distance between the first via row 31 and the second via row 32 is smaller than the biggest outer diameter of a via. A second via group is composed of a third via row 33 and a fourth via row 34 which are arranged in a second overlapping region. The in-out ratio of the third via row 31 is 3/2, which is smaller than that of the first via row, and thus a total of eight vias which are divided into two closely adjacent rows are arranged in the second via group. A third via group is composed of a fifth via row 35 and a sixth via row 36 which are arranged in a third overlapping region. The in-out ratio of the fifth via row 35 is 4/3, which is much smaller than others, and thus a total of seven vias which are divided into two via rows are included in the third via group.

In the above embodiments, current flows into a via through a conductor layer, passes through the via and then flows out through one or more conductor layers. However, one of ordinary skill in this art shall appreciate that a multiple-input-multiple-output via type may be formed by combinations of the above-mentioned one-to-one and one-to-many via type. Thus, the multiple-input-multiple-output via type can be realized by separately arranging the one-to-one and one-to-many via type. For details, please refer to the above-described contents and repeated descriptions are omitted here.

In addition, the conductor layers in the above embodiments are conductor layers in a PCB, for example, copper foils. Actually, the conductor layers may also be conductor layers in other carrier plates, for example, the conductor layers in a Direct Bonding Copper (DBC) plate.

In the via structures and PCBs disclosed in embodiments of the present disclosure, reliable connections between conductor layers in a PCB can be realized without increasing of number of vias, and thereby the present disclosure can avoid the problems of large resistance and high temperature of vias due to thin walls and large current density. Consequently, the lifetimes of the PCB are lengthened, and thus the product reliability is improved After considering the specification and practicing the disclosure here, one of ordinary skill in this will easily think of other implementations. The present disclosure is intended to encompass any modifications, uses or adaptive changes which follow the general principle of the present disclosure and include common knowledge or customary means in this art which are not disclosed herein. The specification and embodiments are illustrative, and the real scope of the present disclosure shall be defined by the appended claims.

It shall be appreciated that the present disclosure is not limited to the above exact structures as described with reference to drawings, and many modifications and changes may be made without departing from the scope of the present disclosure.

What is claimed is:

1. A via structure, provided in two or more conductor layers in the same electrical network, the conductor layers overlapping with each other vertically and comprising at least one current input layer and at least one current output layer;
   wherein the via structure comprises a plurality of rows of vias, each row of vias puncture through at least one current input layer and at least one current output layer, an in-out ratio of each row of vias is (A+1)/A, where A is a positive integer.

2. The via structure according to claim 1, wherein the plurality of rows of vias are divided into a plurality of groups, current input layers and current output layers which vias in one group puncture through are the same, and each group of vias comprise at least one row of vias.

3. The via structure according to claim 2, wherein each group of vias are provided at an edge of one of at least one overlapping region of downward projections for the at least one current input layer and the at least one current output layer.

4. The via structure according to claim 2, wherein the numbers of vias in rows close to interior of the overlapping region are decreased as compared with the numbers of vias in rows close to the edge of the overlapping region.

5. The via structure according to claim 2, wherein a distance between at least two adjacent rows in a group is smaller than a size of a size.

6. The via structure according to claim 1, wherein a distance between at least two adjacent rows of vias is smaller than or equal to a size of a via.

7. The via structure according to claim 1, wherein vias in each row are arranged in a direction perpendicular to a flowing direction along which current flows through the conductor layers.

8. A multilayer circuit board, comprising a via structure provided in two or more conductor layers in the same electrical network, the conductor layers overlapping with each other vertically and comprising at least one current input layer and at least one current output layer;
   wherein the via structure comprises a plurality of rows of vias, each row of vias puncture through at least one current input layer and at least one current output layer, an in-out ratio of each row of vias is (A+1)/A, where A is a positive integer.

9. The via structure according to claim 2, wherein tangential directions of imaginary curved lines formed by linearly fitting positions of respective rows of vias are perpendicular to a flowing direction along which current flows through the conductor layers.

* * * * *